US006962499B2

(12) United States Patent
Yamamoto et al.

(10) Patent No.: US 6,962,499 B2
(45) Date of Patent: Nov. 8, 2005

(54) ELECTRONIC UNIT BY WHICH CONNECTOR CAN BE SECURELY COUPLED WITH MATING CONNECTOR

(75) Inventors: Masaya Yamamoto, Shizuoka (JP); Takatoshi Suzuki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/796,135

(22) Filed: Mar. 10, 2004

(65) Prior Publication Data

US 2005/0020104 A1 Jan. 27, 2005

(30) Foreign Application Priority Data

Mar. 11, 2003 (JP) ............................ 2003-065687

(51) Int. Cl.$^{7}$ ...................... H01R 12/00; H01R 13/60; H01R 13/66; H01R 13/514; H05K 1/00

(52) U.S. Cl. .................. 439/76.2; 439/752; 439/541.5

(58) Field of Search ............................ 439/76.2, 76.1, 439/607, 670, 541.5, 752

(56) References Cited

U.S. PATENT DOCUMENTS

| | | | | |
|---|---|---|---|---|
| 4,379,606 A * | 4/1983 | Clark et al. | ................ | 439/76.1 |
| 4,781,623 A * | 11/1988 | Philippson et al. | ......... | 439/670 |
| 5,023,752 A * | 6/1991 | Detter et al. | ................ | 361/752 |
| 5,295,842 A * | 3/1994 | Ozaki et al. | ............... | 439/76.2 |
| 6,808,397 B2 * | 10/2004 | Kondo | ...................... | 439/76.2 |
| 2004/0235349 A1 * | 11/2004 | Tanaka | ....................... | 439/607 |

FOREIGN PATENT DOCUMENTS

| | | |
|---|---|---|
| JP | 11-284386 | 10/1999 |
| JP | 2000-92652 | 3/2000 |

* cited by examiner

*Primary Examiner*—Chandrika Prasad
(74) *Attorney, Agent, or Firm*—Finnegan, Henderson, Farabow, Garrett, & Dunner, L.L.P.

(57) ABSTRACT

An electronic unit includes a casing, printed circuit board, connector-receiving part, connecting member, and fixing member. The connector-receiving part is formed integrally with a first casing member of the casing. The connecting member includes a terminal and a body of the connecting member attached to the casing. The terminal includes first and second connecting parts. The center of the terminal is attached to the body of the connecting member. A mating connector is inserted into the connector-receiving part along the longitudinal direction of the first connecting part. The first casing member and the connecting member are provided with respective holes, which communicate to each other. The fixing member includes a boss part. The boss part is press-fitted in the holes along the longitudinal direction of the second connecting part so as to fix the connecting member to the first casing member.

4 Claims, 10 Drawing Sheets

ELECTRONIC UNIT BY WHICH CONNECTOR CAN BE SECURELY COUPLED WITH MATING CONNECTOR

BACKGROUND OF THE INVENTION (1) Field of the Invention

The present invention relates to an electronic unit mounted on, for example, a motor vehicle as a mobile unit.

(2) Description of the Related Art

Various electronic units 101 (for example, referring to Japanese Patent Application Laid-Open No. 2000-92652) shown in FIG. 15 such as an electronic control unit (ECU) are mounted on a motor vehicle as a mobile unit. As shown in FIG. 15, such an electronic unit 101 includes a casing 102, printed circuit board 103 received in the casing 102, and connector 104 attached to the casing 102.

The casing 102 is formed in a box-shape to prevent liquid such as water from entering into the inside. Various electronic components 105 are mounted on the printed circuit board 103, on a surface of which a conductor pattern consisting of, for example, copper foil is formed. The conductor pattern and electronic components 105 are electrically connected according to a predetermined pattern.

The connector 104 includes a housing 106 attached to the casing 102 and a plurality of terminals 107 received in the housing 106. The housing 106 is not integrated with the casing 102. The housing 106 is formed in a cylinder-shape integrally including a flat inner wall 106*a* and a plurality of side walls 106*b* continuing to an outer edge of the inner wall 106*a*. Each side wall 106*b* is attached to the casing 102. The inner wall 106*a* continues to an edge of the side wall 106*b*, which edge is located at the inner side of the casing 102. The housing 106 is to be coupled with a mating connector.

The terminal 107 is formed in a bar-shape penetrating through the inner wall 106*a* and one end of the terminal 107 is exposed to between the side walls 106*b*, i.e. to the outside of the casing 102 while an opposite end of the terminal 107 is received in the casing 102. One portion including the one end and another portion including the opposite end of the terminal 107 are formed in a bar-shape continuing to each other. The one portion and the other portion of the terminal 107 cross at right angles with each other. The opposite end of the terminal 107 is electrically connected to the conductor pattern of the printed circuit board 103.

In the electronic unit 101 as constructed above, when the connector 104 is coupled with the mating connector, the one end of the terminal 107 is connected to a terminal fitting of the opposite side. That is, the terminal fitting of the opposite side is electrically connected to the conductor pattern, i.e. the electronic components 105 through the terminal 107. When the connector 104 is coupled with the mating connector, the electronic unit 101 is electrically connected to a wiring harness mounted on the motor vehicle through the mating connector and so on.

In the electronic unit 101 as described in Japanese Patent Application Laid-Open No. 2000-92652, since the housing 106 is not integrated with the casing 102, therefore there is a possibility that liquid such as water might enter into the casing 102 through between the housing 106 and casing 102. For the purpose of preventing such a problem from occurring, as shown in FIG. 16, it can be considered that the housing 106 is formed being integrated with the casing 102.

In such a case, when the casing 102 is molded by injection molding or the like, the bar-shaped terminal 107 must be molded by insert molding. That is, the terminal 107 (shown by an alternate long and two short dashes line in FIG. 16), in which the one portion and the other portion thereof make a straight line together, must be molded by insert molding and bent after the molding. In this case, since the terminal 107, in which the one portion and the other portion thereof make a straight line together, is received in the casing 102, therefore the casing 102 is forced to be made large. Moreover, since the bar-shaped terminal 107 is bent after the molding, therefore the accuracy of the bending of the terminal 107 is hardly attained, causing an increase in man-hour for machining and deterioration in the yield.

Therefore, as shown in FIG. 17, it has been proposed that side walls 106*b* are not formed being integrated with an inner wall 106*a* (for example, referring to Japanese Patent Application Laid-Open No. H11-284386). In an electronic unit 101 shown in FIG. 17, the side walls 106*b* are formed being integrated with a casing 102. A terminal 107, which is bent so as to have one portion and another portion thereof cross at right angles with each other, is molded by insert molding, then the inner wall 106*a* is formed. The inner wall 106*a* is positioned in the casing 102 and slid along the longitudinal direction of the one portion of the bar-shaped terminal 107, thereby attaching the inner wall 106*a* to the casing 102. Thus, in the electronic unit 101 shown in FIG. 17, a connector 104 is attached to the casing 102 as described above.

In the electronic unit 101 as described in Japanese Patent Application Laid-Open No. H11-284386, the inner wall 106*a* is slid along the longitudinal direction of the one portion of the terminal 107, thereby attaching the inner wall 106*a* to the casing 102. Therefore, when the connector 104 is coupled with the mating connector, a force along an arrow Z shown in FIG. 17 is applied by the mating connector along the one portion of the terminal 107. That is, when the connector 104 is coupled with the mating connector, the inner wall 106*a* might possibly fall down abruptly from the casing 102, that is, the terminal 107 might possibly fall down abruptly from the casing 102, resulting in that the terminal 107 cannot be connected to the mating connector.

SUMMARY OF THE INVENTION

It is therefore an objective of the present invention to solve the above problem and to provide an electronic unit, by which the connector can be securely coupled with the mating connector, and the miniaturization and the improvement in the yield can be attained.

In order to attain the above objective, the present invention provides an electronic unit comprising:

a box-shaped casing divided into a first casing member and a second casing member attached to the first casing member;

a printed circuit board for mounting electronic components thereon, the printed circuit board being received in the casing;

a connector-receiving part formed integrally with the first casing member, the connector-receiving part being with a mating connector;

a connecting member received in the casing and attached to the connector-receiving part, the connecting member electrically connecting a terminal fitting of the mating connector to a conductor pattern of the printed circuit board; and a fixing member for fixing the connecting member to the casing, wherein the connecting member includes: a bar-shaped terminal for electrically connecting the terminal fitting of the mating connector to the conductor pattern of the printed circuit board; and a body of the connecting member, to which the center of the bar-shaped terminal is attached, the body being removable from the first casing member, wherein the bar-shaped terminal integrally includes: a first bar-shaped connecting part connecting to the terminal fitting of the mating connector; and a second bar-shaped connecting part electrically connecting to the conductor pattern of the printed circuit board, the second bar-shaped connecting part continuing to the first bar-shaped connecting part and extending in a direction crossing the first bar-shaped connecting part, wherein the body of the connecting member slides from the inside of the first casing member toward the connector-receiving part along the longitudinal direction of the first bar-shaped connecting part so as to be attached to the first casing member, wherein the fixing member is press-fitted in both the body of the connecting member and the first casing member along a direction crossing the longitudinal direction of the first bar-shaped connecting part so as to be fixed to the body of the connecting member and the first casing member.

With the construction described above, the connector-receiving part is formed integrally with the first casing member of the casing, thereby preventing liquid such as water from entering into the casing from between the connector-receiving part and the first casing member.

The connector-receiving part is separated from the body of the connecting member. Therefore, even if a terminal is bent (i.e. not straight) having one portion and another portion that is not parallel to the one portion, the connecting member, i.e. the body of the connecting member can be molded by insert molding or press-fitting such a terminal. In this connection, upon the insert molding, a terminal may be bent after a straight terminal is insert molded. Alternatively, a bent terminal may be insert molded by contriving a shape of the terminal. Further, upon the press-fitting, a terminal may be bent after the straight terminal is press-fitted. A bent terminal may be press-fitted by contriving a method of holding the terminal. Accordingly, the deterioration in the yield of the terminal can be prevented from occurring and the first casing member, i.e. the casing can be prevented from becoming large.

The connecting member is slid along the longitudinal direction of the first connecting part of the terminal so as to attach the connecting member to the first casing member, i.e. to the casing. Further, the fixing member is press-fitted in the connecting member along a direction crossing the first connecting part so as to fix the fixing member to both the connecting member and the first casing member.

Thus, when the mating connector is coupled with the connector-receiving part, a direction of a force applied from the mating connector to the terminal crosses the press-fitting direction of the fixing member. Accordingly, upon coupling with the mating connector, the body of the connecting member, i.e. the connecting member can be prevented from falling down abruptly from the casing, i.e. from the first casing member. That is, the mating connector can be securely coupled with the connector-receiving part.

Preferably, both the first casing member and the body of the connecting member are provided with respective holes, which communicate to each other when the connecting member is attached to the first casing member, the hole extends along a direction crossing the first bar-shaped connecting part and opens on an end surface of the body of the connecting member, the end surface facing the fixing member, the fixing member includes: a flat plate part overlapping with the end surface of the body of the connecting member; and a boss part rising up from the flat plate part and being enterable into the holes provided in both the first casing member and the body of the connecting member when the flat plate part overlaps with the end surface, the flat plate part is overlapped with the end surface and the boss part is press-fitted in both the holes so that the fixing member is fixed to both the first casing member and the body of the connecting member.

With the construction described above, the boss part of the fixing member is press-fitted in both holes provided in the body of the connecting member and the first casing member, the two holes communicate to each other, so as to fix the connecting member to the first casing member with the fixing member. Further, the hole crosses the longitudinal direction of the first connecting part. Therefore, when the mating connector is coupled with the connector-receiving part, a direction of a force applied from the connector to the terminal crosses a press-fitting direction of the fixing member. Accordingly, upon coupling with the mating connector, the body of the connecting member, i.e. the connecting member can be prevented from falling down abruptly from the casing, i.e. from the first casing member. That is, the mating connector can be more securely coupled with the connector-receiving part.

Preferably, the longitudinal direction of the first bar-shaped connecting part and the press-fitting direction of the fixing member cross at right angles each other.

With the construction described above, the longitudinal direction of the first connecting part crosses at right angles the press-fitting direction of the fixing member. Therefore, when the mating connector is coupled with the connector-receiving part, a direction of a force applied from the connector to the terminal crosses at right angles the press-fitting direction of the fixing member. Accordingly, upon coupling with the mating connector, the body of the connecting member, i.e. the connecting member can be prevented from falling down abruptly from the casing, i.e. from the first casing member. That is, the mating connector can be more securely coupled with the connector-receiving part.

DESCRIPTION OF THE PREFERRED EMBODIMENTS

Figure 1:
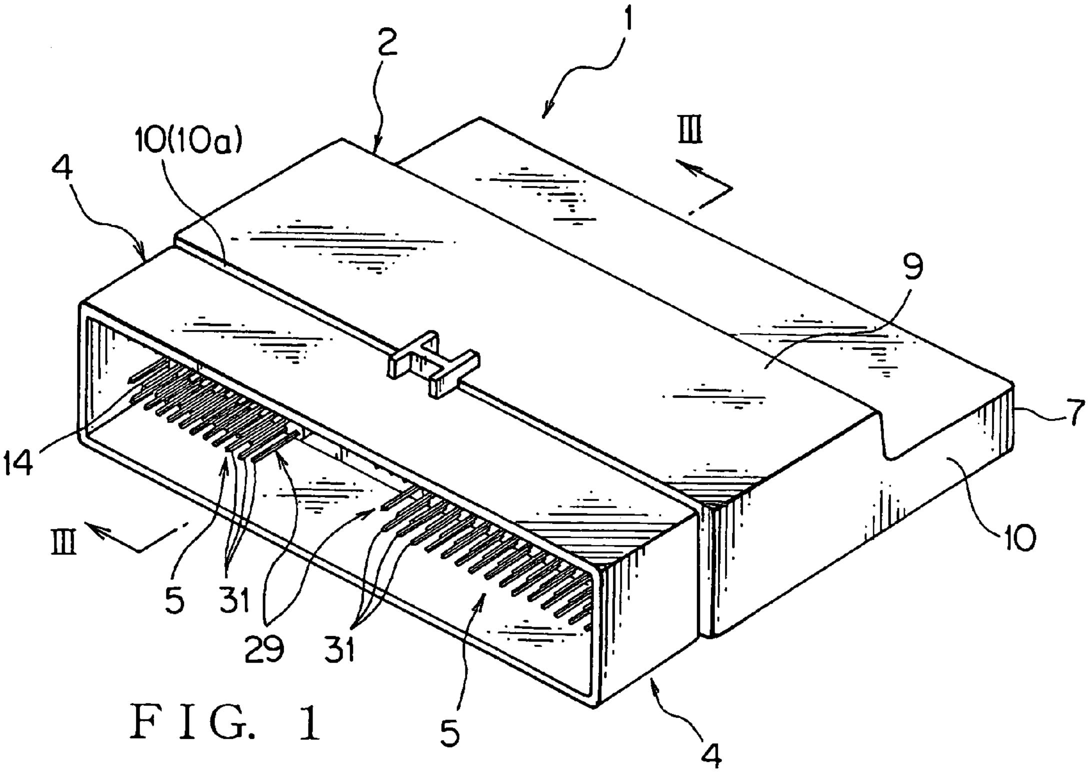
FIG. 1 is a perspective view of an electronic unit according to a preferred embodiment of the present invention.
Figure 4:
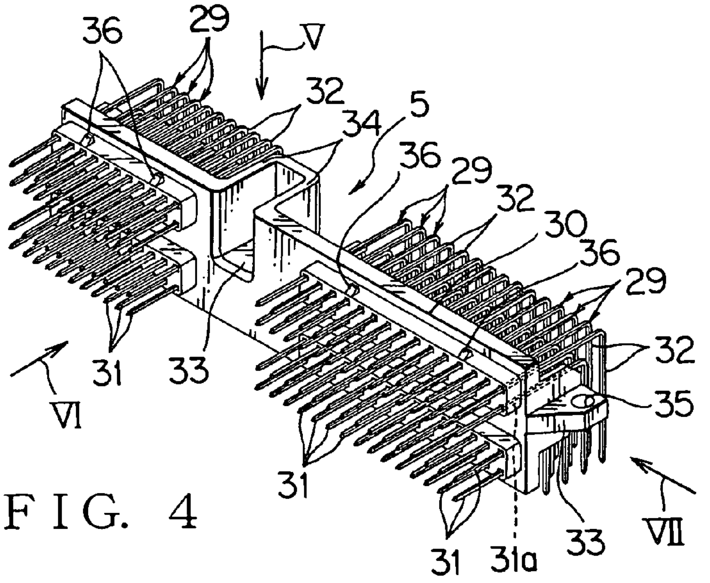
FIG. 4 is a perspective view of a connecting member of the electronic unit shown in FIG. 1.
Figure 2:
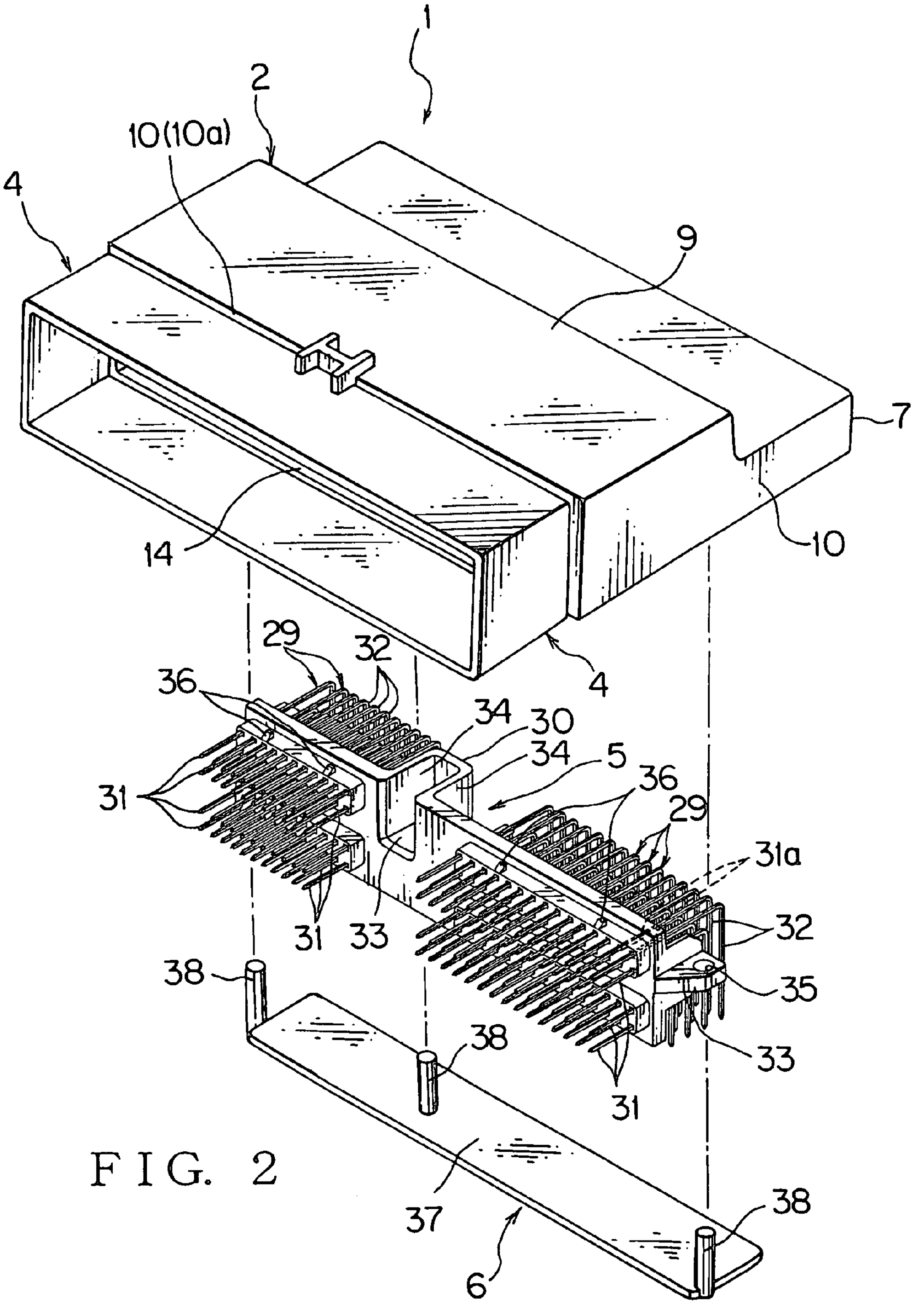
FIG. 2 is an exploded perspective view illustrating a primary part of the electronic unit shown in FIG. 1.
Figure 3:
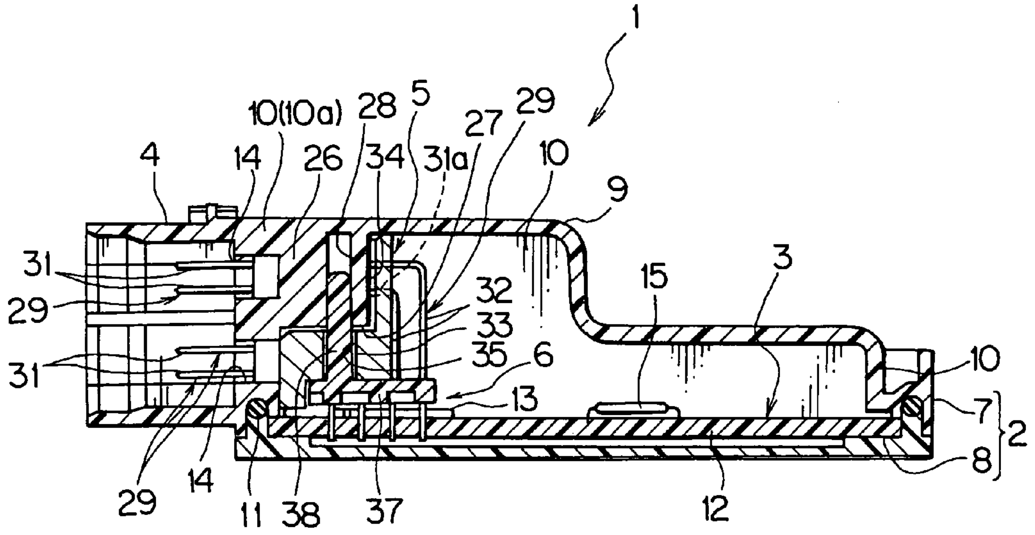
FIG. 3 is a cross sectional view taken along III—III line in FIG. 1.

In the following, an electronic unit according to a preferred embodiment of the present invention will be explained with reference to FIGS. 1–14. The electronic unit 1 shown in FIG. 1 is mounted on a motor vehicle or the like. As shown in FIGS. 1–3, the electronic unit 1 includes a box-shaped casing 2, printed circuit board 3 received in the casing 2, connector-receiving part 4, connecting member 5, and fixing member 6.

The casing 2 is formed in a flat box-shape. The casing 2 is divided into a first casing member 7 and a second casing member 8, which are removable from each other. The first casing member 7 integrally includes a plate-shaped ceiling wall 9 and a plurality of peripheral walls 10, each of which continues to the outer edge of the ceiling wall 9. The plan-view shape of the ceiling wall 9 is formed in a rectangular shape. The peripheral walls 10 stand up in the same direction from the outer edge of the ceiling wall 9. The peripheral walls 10 continue to each other. In an example shown in the figures, there are four peripheral walls 10.

An opening 14 is provided on one peripheral wall 10 (hereinafter, indicated by 10*a*) situated at this side in FIG. 1. The opening 14 penetrates through the peripheral wall 10*a*. The plan-view shape of the opening 14 is a rectangular shape.

The second casing member 8 is made of electrically insulating synthetic resin and formed in a plate-shape. The second casing member 8 is attached to the first casing member 7 in such a manner that the second casing member 8 closes an opening enclosed by the outer edges of the peripheral walls 10 of the first casing member 7. When the first and second casing members 7, 8 are attached to each other, a packing 11 is provided between them.

The packing 11 is made of elastic synthetic resin such as rubber and formed in a wheel-shape. The packing 11 is arranged between the outer edge of the peripheral wall 10 of the first casing member 7 and the outer edge of the second casing member 8. The packing 11 keeps waterproof property between the first casing member 7 and the second casing member 8 by preventing liquid such as water from entering into the casing 2 from between the first casing member 7 and the second casing member 8. A known sealing agent may be used instead of the packing 11.

The printed circuit board 3 includes a flat plate-shaped board 12 and conductor pattern 13 formed on a surface of the board 12. The board 12 is made of electrically insulating synthetic resin. The conductor pattern 13 is made of metal such as copper and formed in a foil-shape (i.e. copper foil). Various electronic components 15 are mounted (i.e. attached) on the printed circuit board 3. The electronic components 15 are electrically connected to each other with the conductor pattern 13 and a predetermined pattern.

The connector-receiving part 4 is formed in a cylindrical shape integrally with the first casing member 7. The connector-receiving part 4 is formed in a so-called female connector housing-shape. The connector-receiving part 4 is formed integrally with the peripheral wall 10*a*. The connector-receiving part 4 continues to the outer edge of the opening 14. A space within the connector-receiving part 4 communicates the inside of the casing 2 to the outside of the casing 2 through the opening 14. The connector-receiving part 4 is to be coupled with a mating connector 16 shown in FIGS. 12–14.

Figure 12:
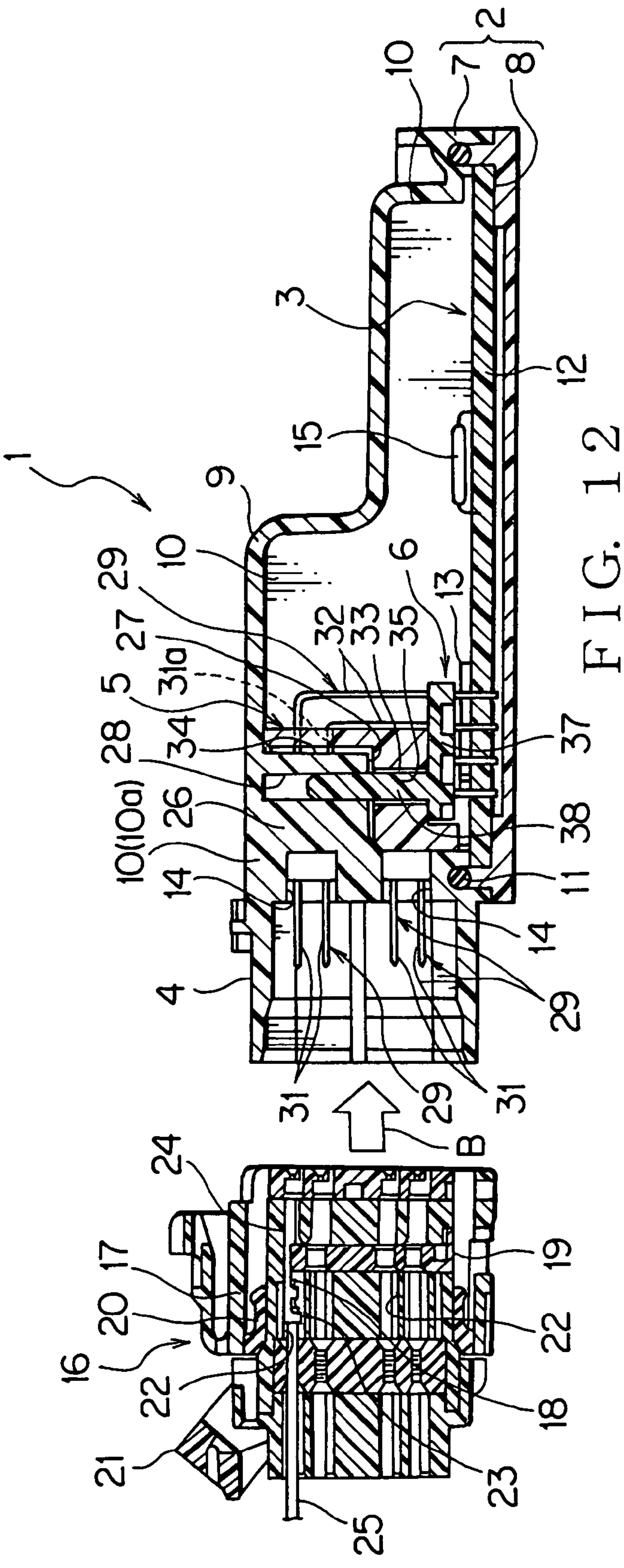
FIG. 12 is a cross sectional view illustrating a state when a boss part of a fixing member is press-fitted in holes of the connecting member and connector-receiving part shown in FIG. 11.
Figure 13:
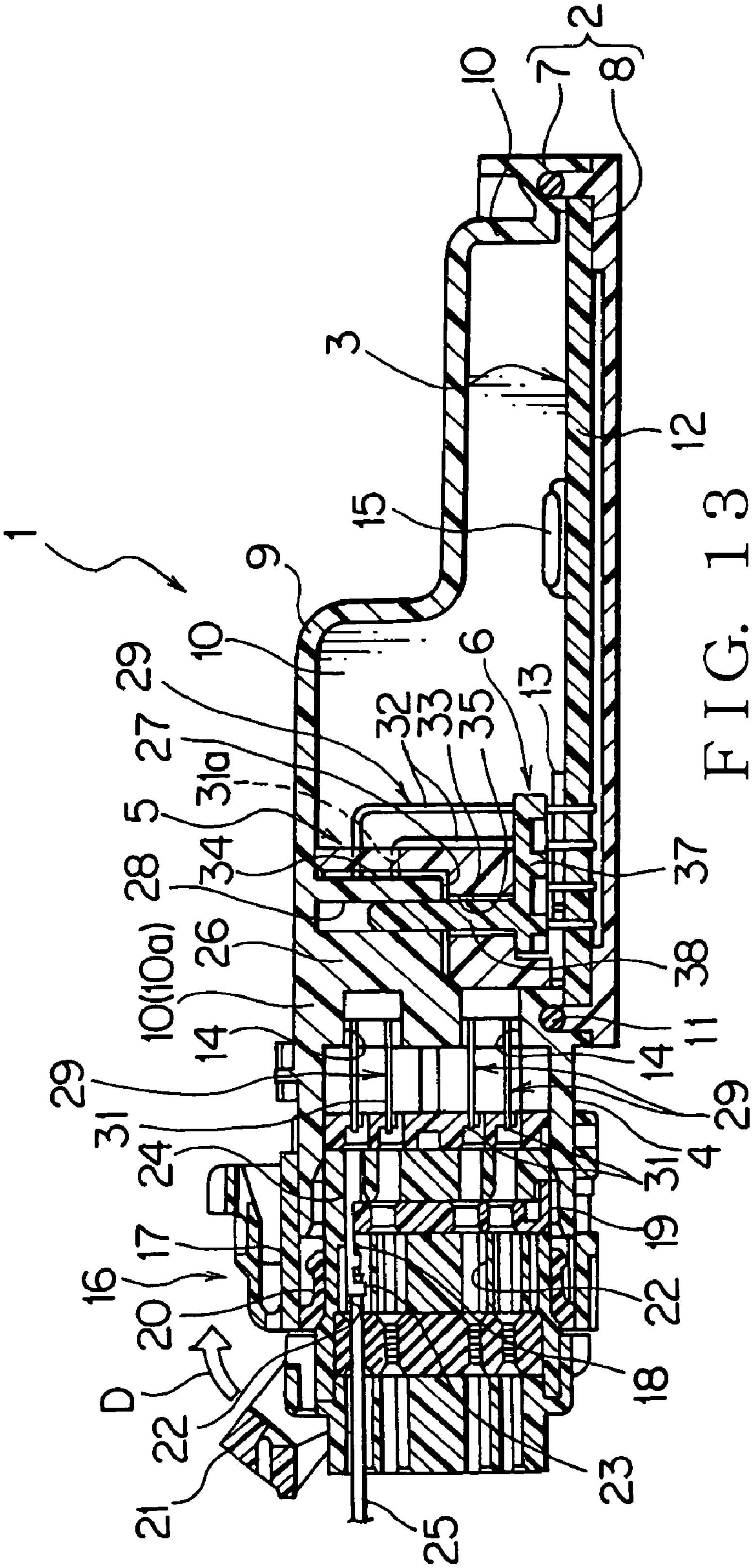
FIG. 13 is a cross sectional view illustrating a state when a mating connector is inserted in the connector-receiving part shown in FIG. 12.
Figure 14:
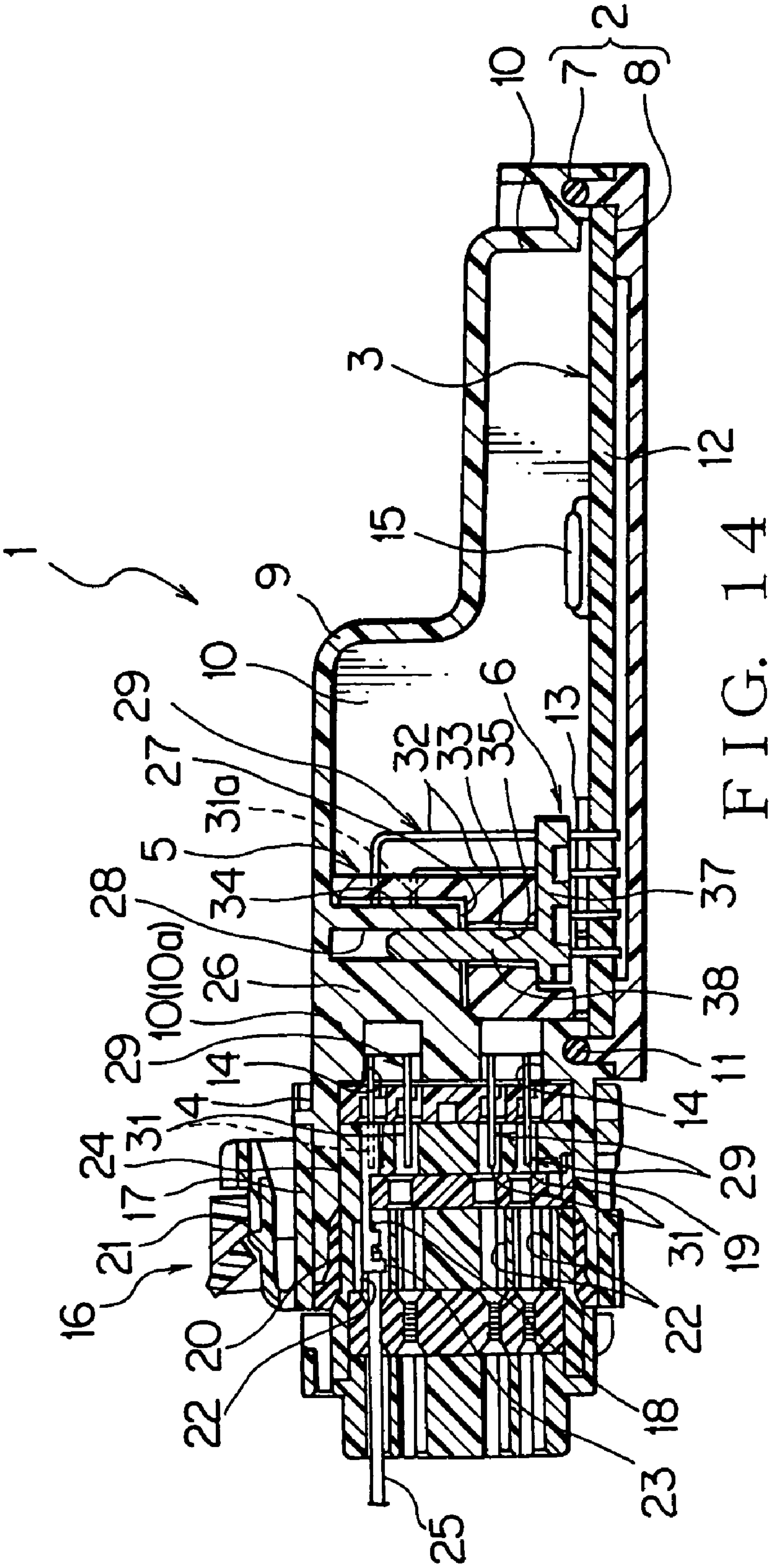
FIG. 14 is a cross sectional view illustrating a state when a lever for coupling of the mating connector shown in FIG. 13 is rotated so as to couple the mating connector with the connector-receiving part.
Figure 15:
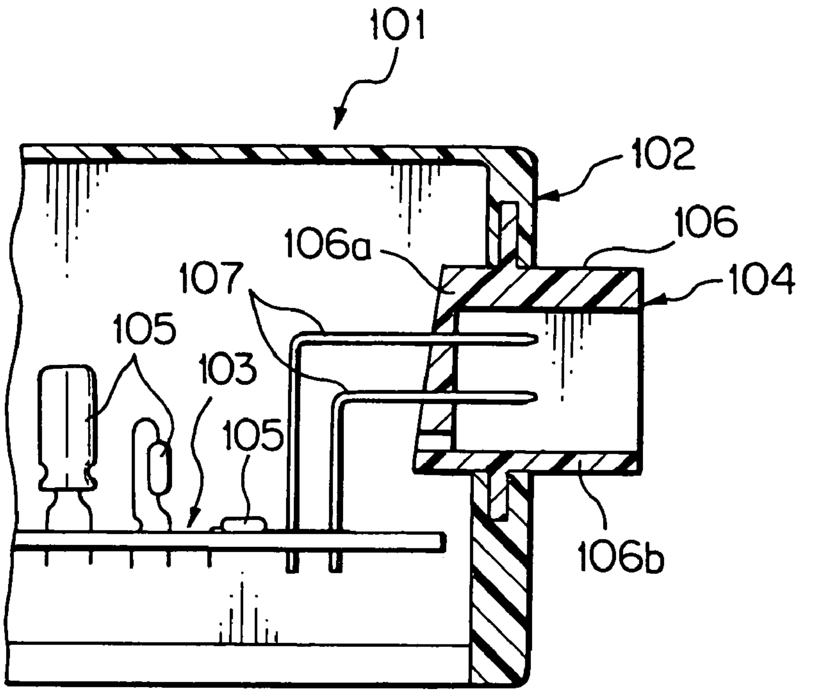
PRIOR ART FIG. 15
FIG. 15 is a cross sectional view illustrating an example of a primary part of a conventional electronic unit.
Figure 16:
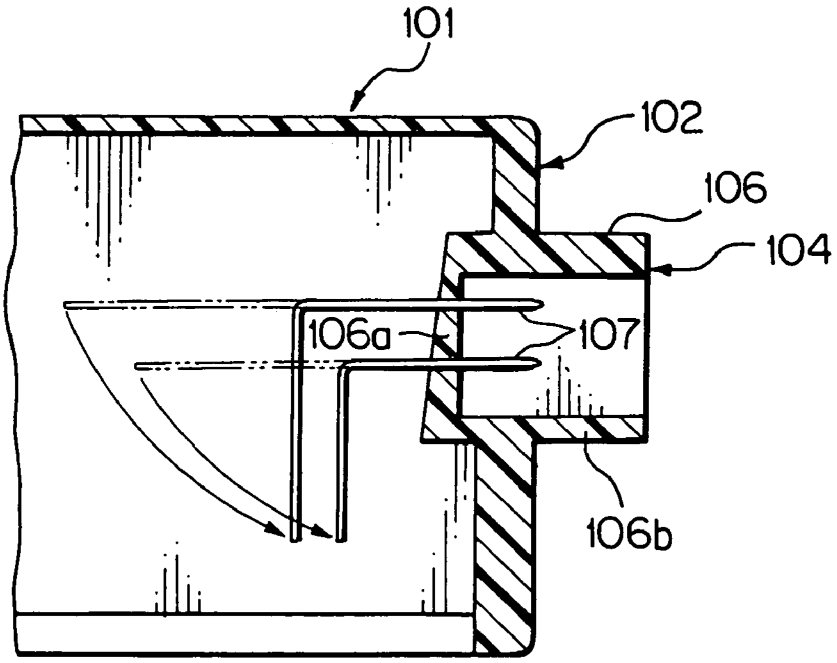
PRIOR ART FIG. 16
FIG. 16 is a cross sectional view illustrating another example of a primary part of a conventional electronic unit.

As shown in FIGS. 12–14, the mating connector 16 includes a connector housing 17, female-type terminal fitting 18 (hereinafter, female terminal 18), spacer 19, waterproof packing 20, and coupling lever 21. The connector housing 17 is made of electrically insulating synthetic resin and formed in a box-shape. The connector housing 17 is provided with a plurality of terminal-receiving chambers 22. Each terminal-receiving chamber 22 is formed in a straight shape. A plurality of the terminal-receiving chambers 22 are arranged in parallel to each other.

The female terminal 18 is formed by bending an electrically conductive metal plate or the like. The female terminal 18 is received in the terminal-receiving chamber 22. In FIGS. 12–14, only one female terminal 18 received in one terminal-receiving chamber 22 is illustrated and the illustration for the other female terminals 18 are omitted. The female terminal 18 includes a wire-connecting part 23 and electric contact part 24. A wire 25 is connected to the wire-connecting part 23. When the wire 25 is connected to the wire-connecting part 23, the wire-connecting part 23 is electrically connected to a core wire of the wire 25. The wires 25 constitute a wiring harness, which is mounted on a motor vehicle and so on.

The electric contact part 24 is formed in a cylindrical shape. When the mating connector 16 is coupled with the connector-receiving part 4, a first connecting part 31 of a terminal 29 (explained later on) of the connecting member 5 enters into the electric contact part 24. When the first connecting part 31 of the terminal 29 enters into the electric contact part 24, the electric contact part 24 is electrically connected to the terminal 29. The female terminal 18 electrically connects the wire 25 to the terminal 29.

The spacer 19 is attached to the connector housing 17. When the spacer 19 is attached to the connector housing 17, the spacer 19 prevents the female terminal 18 from coming out from the terminal-receiving chamber 22.

The waterproof packing 20 is made of elastic synthetic resin such as rubber. When the mating connector 16 is coupled with the connector-receiving part 4, the waterproof packing 20 keeps waterproof property between the connector housing 17 and the connector-receiving part 4. The waterproof packing 20 prevents liquid such as water from entering into a contact part between the female terminal 18 and the first connecting part 31 of the terminal 29, which are connected to each other.

The coupling lever 21 is supported by the connector housing 17 being rotatably around one end of the coupling lever 21. When the connector housing 17 enters in the connector-receiving part 4, the coupling lever 21 is rotated around the one end thereof, thereby allowing the connector-receiving part 4 to approach closely the connector housing 17 so that the first connecting part 31 of the terminal 29 enters into the female terminal 18.

The wires 25 are connected to another electronic unit, the connector housing 17 enters into the connector-receiving part 4, and the first connecting part 31 of the terminal 29 enters into the female terminal 18, thereby the connector 16 is coupled with the connector-receiving part 4. Then, the wire 25 is electrically connected to the terminal 29 through the female terminal 18 and so on.

As shown in FIG. 3, the peripheral wall 10*a* is provided with a slide support part 26. The slide support part 26 protrudes from an inner surface of the peripheral wall 10*a* toward the inside of the first casing member 7, i.e. toward the inside of the casing 2. The slide support part 26 is arranged at the center of the connector-receiving part 4 and arranged between the connector-receiving part 4 and the peripheral wall 10. Since these slide support parts 26 have about the same construction with each other, in the following, only the slide support part 26 arranged at the center of the connector-receiving part 4 will be explained.

The slide support part 26 includes an end surface 27, which faces the printed circuit board 3, i.e. faces the fixing member 6. The end surface 27 is formed flat along the surface of the board 12 of the printed circuit board 3. The end surface 27 is formed flat along the longitudinal direction of the first connecting part 31 of the connecting member 5. A hole 28 is opened on the end surface 27. The plan-view shape of the hole 28 is round. The hole 28 extends in a direction crossing (at right angles) the end surface 27, that is, along the longitudinal direction of a second connecting part 32 (explained later on).

When the connecting member 5 is attached to the first casing member 7, the hole 28 communicates with a hole 35 (explained later on) of the connecting member 5. The slide support part 26 makes the connecting member 5 slidable along the end surface 27, i.e. along the longitudinal direction of the first connecting part 31 by positioning the connecting member 5 on the end surface 27.

As shown in FIGS. 4–7, the connecting member 5 includes a plurality of terminals 29 and a body 30 of the connecting member 5. The terminal 29 is made of electrically conductive metal and formed in a bar-shape. The terminal 29 integrally includes a straight first connecting part 31 and a second connecting part 32, which continues to the first connecting part 31. Each of the first and second connecting parts 31, 32 is formed in a bar-shape.

The longitudinal direction of the first connecting part 31 and that of the second connecting part 32 cross (at right angles) each other. That is, the second connecting part 32 extends along a direction crossing (at right angles) the first connecting part 31. When the connecting member 5 is attached to the first casing member 7, the first connecting part 31 is positioned in the connector-receiving part 4 after passing through the opening 14. When the connecting member 5 is attached to the first casing member 7, the second connecting part 32 is positioned in the first casing member 7, i.e. in the casing 2.

The first connecting part 31 is electrically connected to the female terminal 18 of the mating connector 16, while the second connecting part 32 is electrically connected to the conductor pattern 13 on the printed circuit board 3. The terminal 29 electrically connects the female terminal 18 to the conductor pattern 13. That is, the connecting member 5 electrically connects the female terminal 18 to the conductor pattern 13.

The body 30 of the connecting member 5 is made of electrically insulating synthetic resin. In the body 30, embedded is a center part 31*a* of the first connecting part 31, which is situated near to the second connecting part 32. That is, the body 30 is attached to the center part 31*a* of the terminal 29. The body 30 holds the terminal 29 so that the first connecting parts 31 are arranged in parallel to each other and the second connecting parts 32 are arranged in parallel to each other. The body 30 electrically insulates the terminals 29 from each other.

Figure 5:
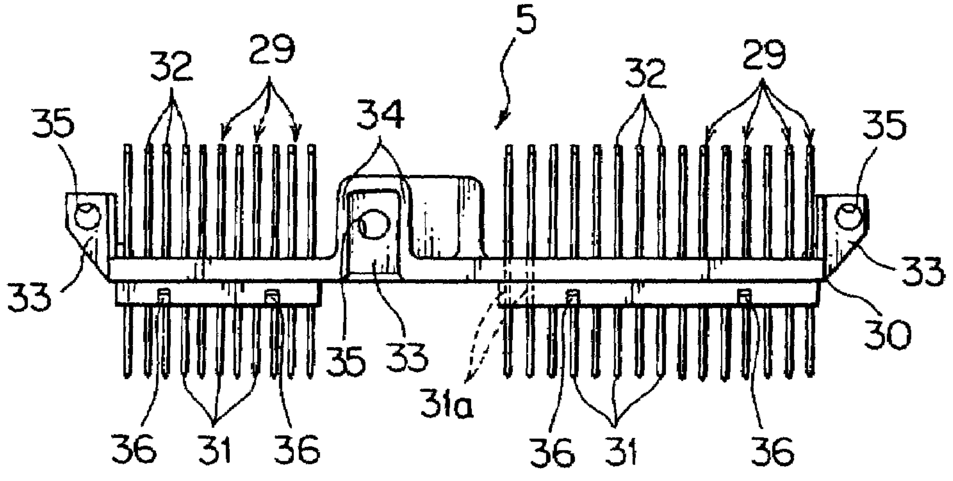
FIG. 5 is a plan view of the connecting member viewed from a direction of arrow V in FIG. 4.
Figure 6:
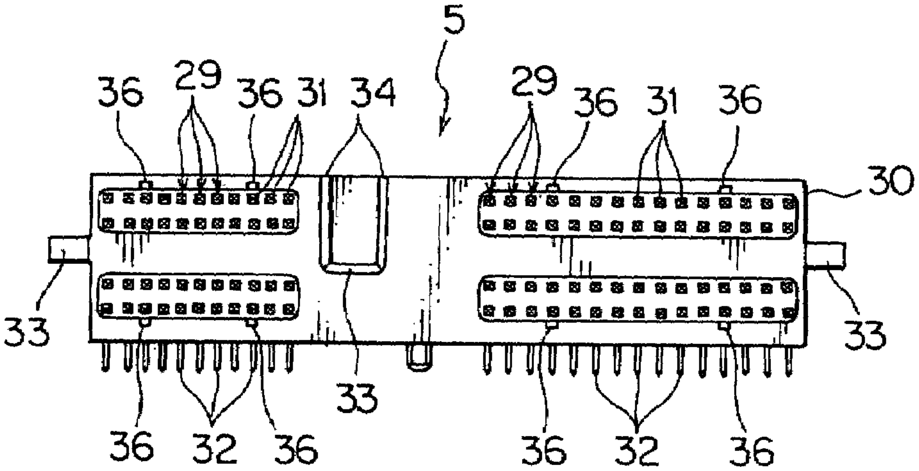
FIG. 6 is a front view of the connecting member viewed from a direction of arrow VI in FIG. 4.
Figure 7:
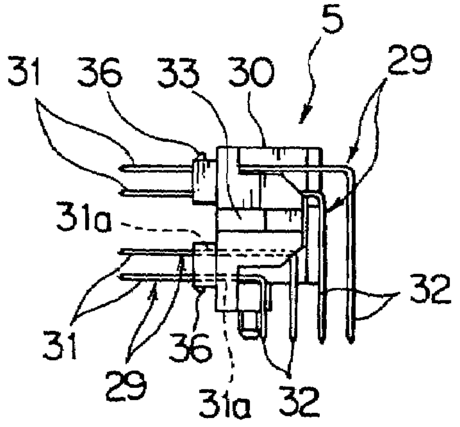
FIG. 7 is a side view of the connecting member viewed from a direction of arrow VII in FIG. 4.

Further, the body 30 of the connecting member 5 includes an overlapping part 33, which overlaps with the end surface 27 of the slide support part 26 when the connecting member 5 is attached to the first casing member 7. As shown in FIG. 5, three overlapping parts 33 are provided. The overlapping part 33 is provided at the center of the body 30 and at both ends of the body 30. Both surfaces of the overlapping part 33 are formed in a flat plate-shape. From both edges of the overlapping part 33 situated at the center of the body 30, a standing wall 34 rises. The standing walls 34 are arranged in parallel to each other, facing each other, having a distance therebetween. A surface of the standing wall 34 is flat along both the longitudinal direction of the first connecting part 31 of the terminal 29 attached to the body 30 and the longitudinal direction of the second connecting part 32.

A hole 35 is opened on the overlapping part 33. When the connecting member 5 is attached to the first casing member 7, the hole 35 communicates with the hole 28 described above. The plan-view shape of the hole 35 is round. The hole 35 extends along a direction crossing at right angles the longitudinal direction of the first connecting part 31, that is, along the longitudinal direction of the second connecting part 32. The holes 28 and 35 have the same axis.

Further, the body 30 includes a plurality of locking projections 36. When the body 30 (i.e. the connecting member 5) is attached to the first casing member 7, the locking projection 36 is locked on an inner surface of the connector-receiving part 4. The body 30 is removable from the first casing member 7 because the locking projection 36 is locked on or released from the inner surface of the connector-receiving part 4. The body 30 (i.e. the connecting member 5) is attached to the connector-receiving part 4 when the locking projection 36 is locked on the inner surface of the connector-receiving part 4.

As shown in FIG. 2, the fixing member 6 integrally includes a flat plate part 37 and a plurality of boss parts 38 rising up from the flat plate part 37. Both surfaces of the flat plate part 37 are formed in a flat plate-shape. The boss part 38 is formed in a cylindrical shape. A center axis of the boss part 38 crosses at right angles a surface of the flat plate part 37. An outer diameter of the boss part 38 is slightly larger than an inner diameter of the holes 28 and 35. As shown in FIG. 2, three boss parts 38 are provided. The boss parts 38 correspond to the slide support part 26 and the overlapping part 33.

When the holes 28 and 35 communicate with each other, the fixing member 6 faces the end surface 27 putting the overlapping part 33 therebetween. Then, each boss part 38 faces the hole 28 or 35. Then, the boss part 38 is press-fitted in the hole 28 or 35. At this time, the boss part 38, i.e. the fixing member 6 is press-fitted in the hole 28 or 35 along a direction crossing at right angles the longitudinal direction of the first connecting part 31, that is, along the longitudinal direction of the second connecting part 32 (shown by an arrow C in FIG. 11). The arrow C indicates the press-fitting direction described in this specification. The arrow C crosses (at right angles) both the end surface 27 and both surfaces of the flat plate part 37. When the flat plate part 37 overlaps with the end surface 27, the boss parts 38 enters into both holes 28 and 35. When the boss parts 38 enters into both holes 28 and 35, the fixing member 6 fixes the connecting member 5 to the first casing member 7, i.e. to the casing 2.

Figure 8:
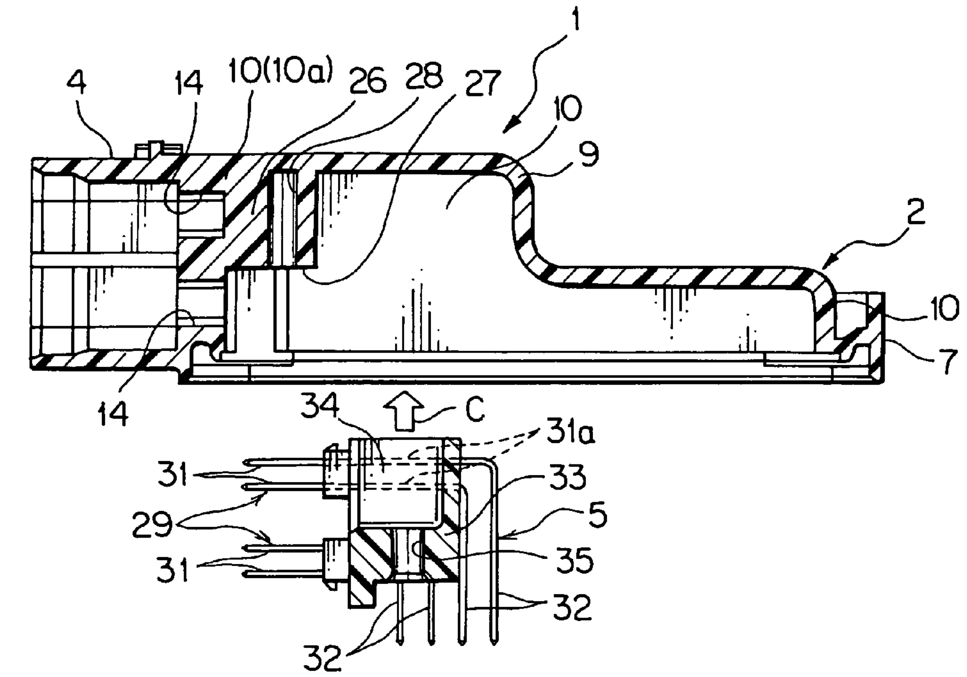
FIG. 8 is a cross sectional view illustrating a state when a connecting member is being inserted into a casing of the electronic unit shown in FIG. 3.

Upon assembling the electronic unit 1 constructed as described above, electronic components 15 are attached on the respective predetermined positions of the printed circuit board 3 and the center part 31*a* of the terminal 29 is embedded in the body 30 of the connecting member 5 by insert molding or press-fitting so as to assemble the connecting member in advance. Then, as shown in FIG. 8, the connecting member 5 is inserted into the first casing member 7 along the arrow C through an opening enclosed by the outer edges of the peripheral walls 10 of the first casing member 7. At this time, the connecting member 5 is inserted into the first casing member 7 along the longitudinal direction of the second connecting part 32 so as to allow the first connecting part 31 to face the opening 14.

Figure 9:
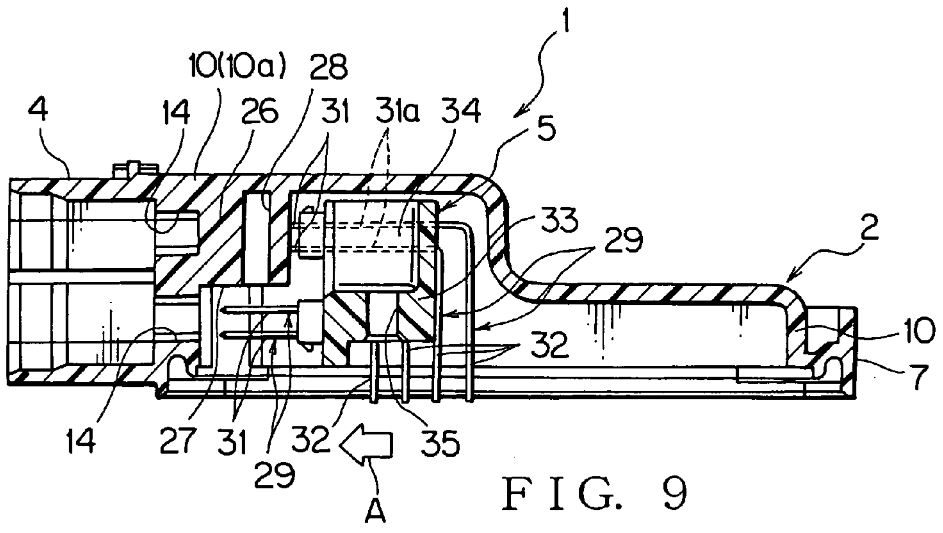
FIG. 9 is a cross sectional view illustrating a state when the connecting member is inserted in the casing of the electronic unit shown in FIG. 8.

Then, the connecting member 5 is allowed to approach the connector-receiving part 4 along the longitudinal direction of the first connecting part 31, which is shown by an arrow A in FIG. 9. Then, the end surface 27 of the slide support part 26 overlaps with the surface of the overlapping part 33 and the connecting member 5 is guided by the end surface 27 and the surface of the overlapping part 33 so as to be slid toward the connector-receiving part 4. Thus, the body 30 of the connecting member 5 is slid from the inside of the first casing member 7 toward the connector-receiving part 4 along the longitudinal direction of the first connecting part 31 so as to be attached to the first casing member 7.

Figure 10:
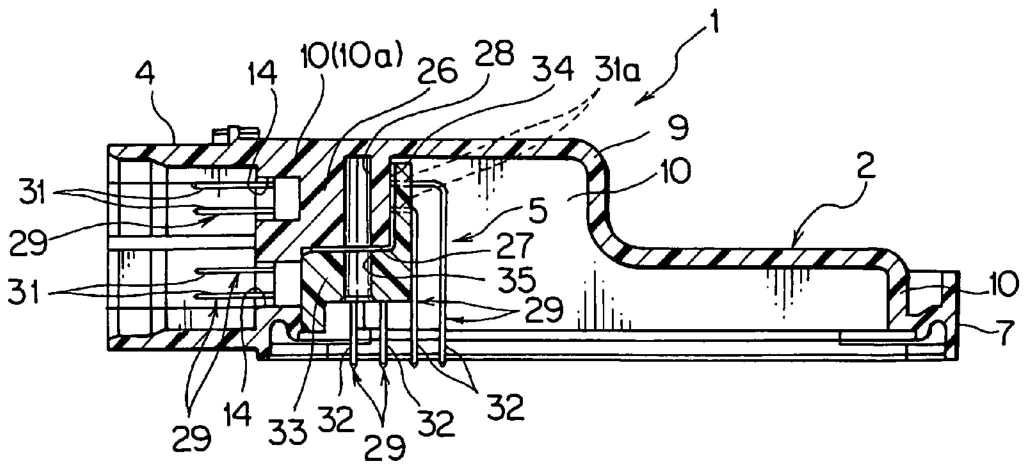
FIG. 10 is a cross sectional view illustrating a state when the connecting member shown in FIG. 9 is slid toward a connector-receiving part of the electronic unit.

Then, as shown in FIG. 10, the body 30 abuts against an inner surface of the peripheral wall 10*a*. The first connecting part 31 is positioned in the connector-receiving part 4 through the opening 14, while the hole 28 opened on the end surface 27 communicates with the hole 35, which penetrates through the overlapping part 33. Further, the locking projection 36 locks on the inner surface of the connector-receiving part 4.

Figure 11:
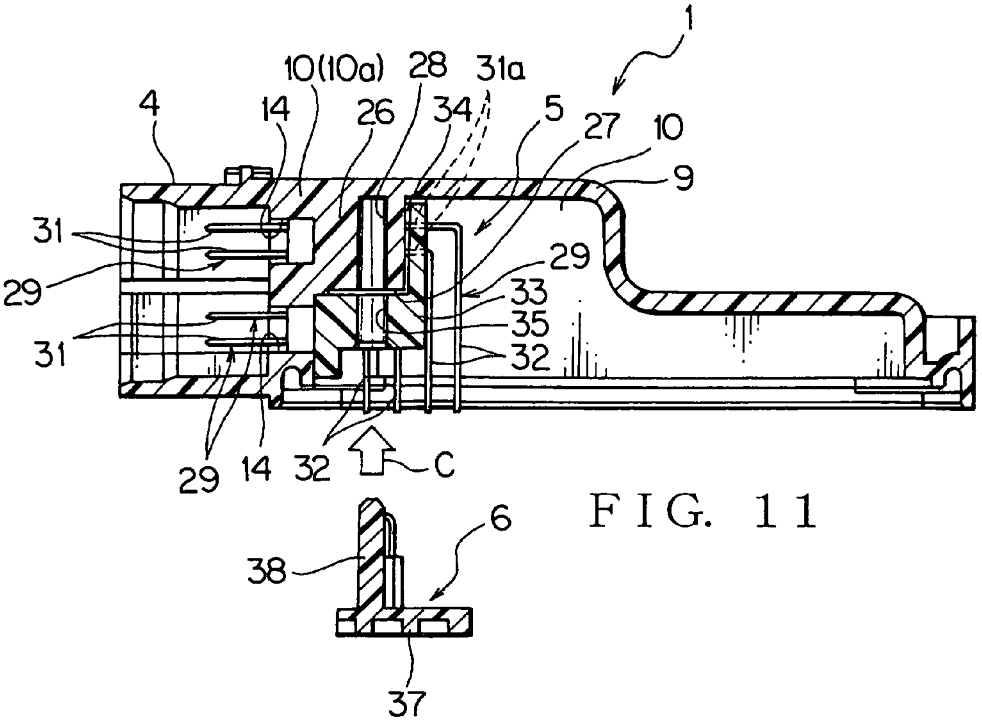
FIG. 11 is a cross sectional view illustrating a state when a boss part of a fixing member is being press-fitted into holes of the connecting member and connector-receiving part shown in FIG. 10.
Figure 17:
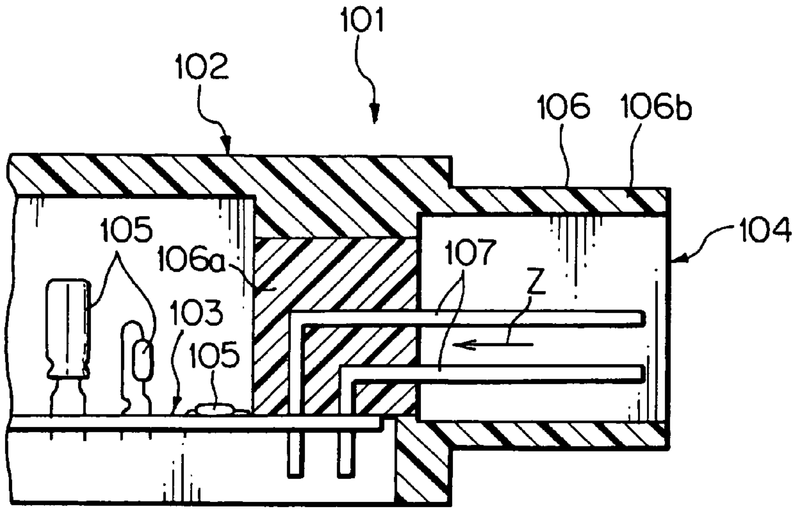
PRIOR ART FIG. 17
FIG. 17 is a cross sectional view illustrating a further example of a primary part of a conventional electronic unit.

Thereafter, the holes 28 and 35 and the boss part 38 of the fixing member 6 are faced each other along the longitudinal direction of the second connecting part 32, which direction is indicated by an arrow C in FIG. 11. The boss part 38 is press-fitted in the holes 28 and 35 along the arrow C. Then, the end surface 27 overlaps with the surface of the flat plate part 37 and the boss part 38 enters in both holes 28 and 35. Thus, the fixing member 6 fixes the connecting member 5 to the first casing member 7, i.e. to the casing 2.

Then, the printed circuit board 3 is mounted, and the conductor pattern 13 of the printed circuit board 3 is electrically connected to the second connecting part 32 of the terminal 29 of the connecting member 5 according to a predetermined pattern. At this time, an end part of the printed circuit board 3 is overlapped with the flat plate part 37 of the fixing member 6. Then, a packing 11 is attached to the outer edge of the peripheral wall 10 so as to attach the second casing member 8 to the first casing member 7. The casing 2 is assembled and the inside of the casing 2 is kept waterproof. Thus, the electronic unit 1 is assembled.

When the mating connector 16 is coupled with the connector-receiving part 4 of the electronic unit 1, as shown in FIG. 12, first, the mating connector 16 is faced the connector-receiving part 4 along an arrow B, which indicates the longitudinal direction of the first connecting part 31. Thereafter, the mating connector 16 is inserted into the connector-receiving part 4 along the arrow B. When the first connecting part 31 approaches the female terminal 18, the coupling lever 21 is rotated around the one end along the arrow D shown in FIG. 13.

Then, the connector-receiving part 4 further approaches the connector 16, as shown in FIG. 14, the first connecting part 31 enters into the electric contact part 24 of the female terminal 18. Thus, the mating connector 169 is coupled with the connector-receiving part 4, so that the female terminal 18 is electrically connected to the terminal 29. Then, the wires 25, i.e. a wiring harness mounted on a motor vehicle or the like is electrically connected to the electronic components 15 mounted on the printed circuit board 3 according to a predetermined pattern.

In the preferred embodiment, the connector-receiving part 4 is formed integrally with the first casing member 7 of the casing 2, thereby preventing liquid such as water from entering into the casing 2 from between the connector-receiving part 4 and the first casing member 7.

Further, the connector-receiving part 4 is separated from the body 30 of the connecting member 5. Therefore, although the terminal 29 is bent (i.e. not straight) having the first connecting part 31 and the second connecting part 32 that is not parallel to the first connecting part 31, the connecting member 5, i.e. the body 30 of the connecting member 5 can be molded by insert-molding or press-fitting. In this connection, upon the insert molding, the terminal 29 may be bent after the straight terminal 29 is insert-molded. Alternatively, the bent terminal 29 may be insert-molded by contriving a shape of the terminal 29. Further, upon the press-fitting, the terminal 29 may be bent after the straight terminal 29 is press-fitted. The bent terminal 29 may be press-fitted by contriving a method of holding the terminal. Accordingly, the deterioration in the yield of the terminal 29, i.e. the deterioration in the yield of the connecting member 5 can be prevented from occurring and the first casing member 7, i.e. the casing 2 can be prevented from becoming large.

The connecting member 5 is slid along the longitudinal direction (the arrow A in FIG. 9) of the first connecting part 31 of the terminal 29 so as to attach the connecting member 5 to the first casing member 7, i.e. to the casing 2. Further, the fixing member 6 is press-fitted into the connecting member 5 along a direction (the arrow C in FIG. 11) crossing (at right angles) the longitudinal direction of the first connecting part 31 so as to fix the fixing member 6 to both the connecting member 5 and the first casing member 7.

Thus, when the mating connector 16 is coupled with the connector-receiving part 4, a direction (the arrow B in FIG. 12) of a force applied from the mating connector 16 to the terminal 29 crosses (at right angles) the press-fitting direction C of the fixing member 6. Accordingly, upon coupling with the mating connector 16, the body 30 of the connecting member 5, i.e. the connecting member 5 can be prevented from falling down abruptly from the casing 2, i.e. from the first casing member 7. That is, the mating connector 16 can be securely coupled with the connector-receiving part 4.

The boss part 38 of the fixing member 6 is press-fitted in both holes 35 and 28 provided in the body 30 of the connecting member 5 and in the first casing member 7, respectively, so as to fix the connecting member 5 to the first casing member 7 with the fixing member 6. Further, an extending direction of the holes 35 and 28 crosses (at right angles) the longitudinal direction of the first connecting part 31. Therefore, when the mating connector 16 is coupled with the connector-receiving part 4, a direction (the arrow B in FIG. 12) of a force applied from the connector 16 to the terminal 31 securely crosses (at right angles) a press-fitting direction C of the fixing member 6.

Accordingly, upon coupling with the mating connector 16, the body 30 of the connecting member 5, i.e. the connecting member 5 can be prevented from falling down abruptly from the casing 2, i.e. from the first casing member 7. That is, the mating connector 16 can be more securely coupled with the connector-receiving part 4.

The longitudinal direction of the first connecting part 31 crosses at right angles the center axis of the boss part 38, i.e. the press-fitting direction C of the fixing member 6. Therefore, when the mating connector 16 is coupled with the connector-receiving part 4, a direction (the arrow B in FIG. 12) of a force applied from the connector 16 to the terminal 29 crosses at right angles the press-fitting direction C of the fixing member 6. Accordingly, upon coupling with the mating connector 16, the body 30 of the connecting member 5, i.e. the connecting member 5 can be prevented from falling down abruptly from the casing 2, i.e. from the first casing member 7. That is, the mating connector 16 can be more securely coupled with the connector-receiving part 4.

The aforementioned preferred embodiments are described to aid in understanding the present invention and variations may be made by one skilled in the art without departing from the spirit and scope of the present invention.

What is claimed is:

1. An electronic unit comprising:

a box-shaped casing divided into a first casing member and a second casing member attached to the first casing member;

a printed circuit board for mounting electronic components thereon, the printed circuit board being received in the casing;

a connector-receiving part formed integrally with the first casing member, the connector-receiving part to be coupled with a mating connector;

a connecting member received in the casing and attached to the connector-receiving part, the connecting member electrically connecting a terminal fitting of the mating connector to a conductor pattern of the printed circuit board; and a fixing member for fixing the connecting member to the casing, wherein the connecting member includes: a bar-shaped terminal for electrically connecting the terminal fitting of the mating connector to the conductor pattern of the printed circuit board; and a body of the connecting member, to which the center of the bar-shaped terminal is attached, the body being removable from the first casing member, wherein the bar-shaped terminal integrally includes: a first bar-shaped connecting part connecting to the terminal fitting of the mating connector; and a second bar-shaped connecting part electrically connecting to the conductor pattern of the printed circuit board, the second bar-shaped connecting part continuing to the first bar-shaped connecting part and extending in a direction crossing the first bar-shaped connecting part, wherein the body of the connecting member slides from the inside of the first casing member toward the connector-receiving part along the longitudinal direction of the first bar-shaped connecting part so as to be attached to the first casing member, wherein the fixing member is press-fitted in both the body of the connecting member and the first casing member along a direction crossing the longitudinal direction of the first bar-shaped connecting part so as to be fixed to the body of the connecting member and the first casing member.

2. The electronic unit according to claim 1, wherein both the first casing member and the body of the connecting member are provided with respective holes, which communicate to each other when the connecting member is attached to the first casing member, wherein the hole extends along a direction crossing the first bar-shaped connecting part and opens on an end surface of the body of the connecting member, the end surface facing the fixing member, wherein the fixing member includes: a flat plate part overlapping with the end surface of the body of the connecting member; and a boss part rising up from the flat plate part and being enterable into the holes provided in both the first casing member and the body of the connecting member when the flat plate part overlaps with the end surface, wherein the flat plate part is overlapped with the end surface and the boss part is press-fitted in both the holes so that the fixing member is fixed to both the first casing member and the body of the connecting member.

3. The electronic unit according to claim 1, wherein the longitudinal direction of the first bar-shaped connecting part and the press-fitting direction of the fixing member cross at right angles each other.

4. The electronic unit according to claim 2, wherein the longitudinal direction of the first bar-shaped connecting part and the press-fitting direction of the fixing member cross at right angles each other.

* * * * *